United States Patent
Frank et al.

(10) Patent No.: US 10,238,016 B2
(45) Date of Patent: Mar. 19, 2019

(54) ELECTROMAGNETIC INTERFERENCE CONTAINMENT SYSTEM

(71) Applicant: EMC IP Holding Company LLC, Hopkinton, MA (US)

(72) Inventors: Christopher Frank, San Jose, CA (US); Timothy Olesiewicz, Dubin, CA (US); Clifford Willis, Tracy, CA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 187 days.

(21) Appl. No.: 15/445,065

(22) Filed: Feb. 28, 2017

(65) Prior Publication Data

US 2017/0172017 A1 Jun. 15, 2017

Related U.S. Application Data

(63) Continuation of application No. 14/530,631, filed on Oct. 31, 2014, now Pat. No. 9,622,394.

(Continued)

(51) Int. Cl.
*H05K 9/00* (2006.01)
*H05K 7/20* (2006.01)
(Continued)

(52) U.S. Cl.
CPC ......... *H05K 9/0015* (2013.01); *H05K 5/0021* (2013.01); *H05K 5/0026* (2013.01);
(Continued)

(58) Field of Classification Search
CPC .. H05K 9/0015; H05K 5/0021; H05K 5/0026; H05K 7/20136; H05K 7/2039;
(Continued)

(56) References Cited

U.S. PATENT DOCUMENTS

D257,345 S 10/1980 Levy
D260,881 S 9/1981 McKinsey et al.
(Continued)

FOREIGN PATENT DOCUMENTS

DE 102006016743 A1 10/2007
EP 1420623 A1 5/2004
(Continued)

OTHER PUBLICATIONS

Press Release, "3M Introduces New CompactFlash brand Type II Card Ejectors for Long Guide CFII Headers," 3M News, www.3M.com, Jul. 6, 2006 (2 pages).
(Continued)

*Primary Examiner* — Robert J Hoffberg
*Assistant Examiner* — Hung Dang
(74) *Attorney, Agent, or Firm* — Chamberlain, Hrdlicka, White, Williams & Aughtry

(57) ABSTRACT

A chassis includes a flash module comprising a cover and an integrated connector, a metal stiffener, an electromagnetic interference (EMI) gasket, and a midplane. The flash module is connected to the midplane using the integrated connector, the integrated connector extends past the cover of the flash module, and, when the flash module is connected to the midplane, the cover of the flash module is in direct contact with the EMI gasket, in which the metal stiffener is interposed between the EMI gasket and the midplane.

9 Claims, 10 Drawing Sheets

Related U.S. Application Data

(60) Provisional application No. 62/005,787, filed on May 30, 2014.

(51) Int. Cl.
*H05K 7/14* (2006.01)
*H05K 5/00* (2006.01)
*G06F 1/18* (2006.01)

(52) U.S. Cl.
CPC ......... *H05K 7/1424* (2013.01); *H05K 7/2039* (2013.01); *H05K 7/20136* (2013.01); *H05K 7/20563* (2013.01); *H05K 9/0081* (2013.01); *G06F 1/182* (2013.01); *H05K 7/1445* (2013.01)

(58) Field of Classification Search
CPC ............. H05K 7/20563; H05K 9/0081; H05K 999/99; G06F 1/182
See application file for complete search history.

(56) References Cited

U.S. PATENT DOCUMENTS

| | | |
|---|---|---|
| 4,648,066 A | 3/1987 | Pitt |
| 5,023,754 A * | 6/1991 | Aug .................... H05K 7/1445 361/748 |
| 5,045,960 A | 9/1991 | Eding |
| 5,065,321 A | 11/1991 | Bezos et al. |
| D332,256 S | 1/1993 | Lewis |
| 5,214,550 A | 5/1993 | Chan |
| 5,253,129 A | 10/1993 | Blackborow et al. |
| 5,297,067 A | 3/1994 | Blackborow et al. |
| 5,316,488 A | 5/1994 | Gardner et al. |
| 5,387,115 A | 2/1995 | Kozel et al. |
| 5,519,573 A | 5/1996 | Cobb et al. |
| 5,570,270 A | 10/1996 | Naedel et al. |
| 5,691,860 A | 11/1997 | Hoppe |
| 5,701,894 A | 12/1997 | Cherry et al. |
| 5,764,480 A | 6/1998 | Crump et al. |
| 5,825,616 A | 10/1998 | Howell et al. |
| D408,379 S | 4/1999 | McGraw et al. |
| 6,083,018 A | 7/2000 | Hara et al. |
| 6,137,759 A | 10/2000 | Ogiro et al. |
| 6,174,180 B1 | 1/2001 | Chen |
| 6,185,103 B1 | 2/2001 | Yamada |
| 6,222,727 B1 | 4/2001 | Wu |
| 6,324,062 B1 | 11/2001 | Treiber et al. |
| 6,324,075 B1 | 11/2001 | Unrein et al. |
| 6,359,778 B1 | 3/2002 | Wu |
| 6,373,696 B1 | 4/2002 | Bolognia et al. |
| 6,388,884 B1 | 5/2002 | Greco et al. |
| 6,396,704 B1 | 5/2002 | White |
| 6,538,903 B1 * | 3/2003 | Radu .................... G06F 1/181 174/359 |
| 6,654,235 B2 | 11/2003 | Imsand |
| 6,683,785 B1 | 1/2004 | Chen |
| 6,987,927 B1 | 1/2006 | Battaglia et al. |
| 7,023,704 B1 | 4/2006 | Zarnowitz et al. |
| 7,042,737 B1 * | 5/2006 | Woolsey ............. H05K 7/1445 174/384 |
| 7,088,579 B1 | 8/2006 | Konshak |
| 7,242,576 B2 | 7/2007 | Coster et al. |
| 7,251,145 B1 | 7/2007 | Reznikov |
| 7,362,566 B1 | 4/2008 | Sivertsen |
| 7,396,244 B1 | 7/2008 | Barna et al. |
| 7,499,286 B2 | 3/2009 | Berke et al. |
| 7,719,855 B2 | 5/2010 | Berke et al. |
| 7,944,691 B1 | 5/2011 | Pounds |
| D698,792 S | 2/2014 | Lin et al. |
| 8,737,067 B1 | 5/2014 | Kim et al. |
| 8,760,859 B2 * | 6/2014 | Fuchs .................... G06F 1/182 174/383 |
| 8,897,006 B2 | 11/2014 | Ito et al. |
| 8,969,816 B2 | 3/2015 | Caruba et al. |
| 9,395,772 B2 | 7/2016 | Degner et al. |
| 9,622,394 B1 * | 4/2017 | Frank ................. H05K 7/20136 |
| 2002/0018423 A1 | 2/2002 | Goble |
| 2002/0030927 A1 | 3/2002 | Kimura et al. |
| 2002/0033890 A1 | 3/2002 | Nicklos et al. |
| 2002/0114254 A1 | 8/2002 | Ohgaki |
| 2002/0122295 A1 | 9/2002 | Laing |
| 2002/0169912 A1 | 11/2002 | Mills et al. |
| 2002/0182896 A1 | 12/2002 | Welsh et al. |
| 2003/0041203 A1 | 2/2003 | Jones et al. |
| 2003/0136849 A1 | 7/2003 | Adelmann |
| 2003/0161199 A1 | 8/2003 | Estakhri |
| 2004/0057702 A1 | 3/2004 | Battaglia et al. |
| 2004/0213141 A1 | 10/2004 | Lin |
| 2004/0228184 A1 | 11/2004 | Mathiowetz |
| 2004/0233629 A1 | 11/2004 | Wang et al. |
| 2004/0242041 A1 | 12/2004 | Ngo |
| 2005/0018397 A1 | 1/2005 | Kay et al. |
| 2005/0259395 A1 | 11/2005 | Espinoza-Ibarra et al. |
| 2006/0030080 A1 | 2/2006 | Hsueh et al. |
| 2006/0061955 A1 | 3/2006 | Imblum |
| 2006/0072239 A1 | 4/2006 | Iftikar |
| 2006/0146441 A1 | 7/2006 | Chih |
| 2007/0070669 A1 | 3/2007 | Tsem |
| 2007/0217171 A1 | 9/2007 | Le |
| 2007/0274039 A1 | 11/2007 | Hamlin |
| 2007/0293137 A1 | 12/2007 | Crippen et al. |
| 2008/0002348 A1 | 1/2008 | Kim et al. |
| 2008/0094799 A1 | 4/2008 | Zieman et al. |
| 2008/0112125 A1 | 5/2008 | Martin et al. |
| 2008/0218949 A1 | 9/2008 | Hughes |
| 2008/0218957 A1 | 9/2008 | Kim et al. |
| 2008/0225479 A1 | 9/2008 | Zieman et al. |
| 2008/0266779 A1 | 10/2008 | Thomas et al. |
| 2008/0298009 A1 | 12/2008 | Weng et al. |
| 2008/0298014 A1 | 12/2008 | Franco |
| 2008/0310107 A1 | 12/2008 | Vinson et al. |
| 2008/0316704 A1 | 12/2008 | Vinson et al. |
| 2009/0016019 A1 | 1/2009 | Bandholz et al. |
| 2009/0034349 A1 | 2/2009 | Miura |
| 2009/0086456 A1 | 4/2009 | Milo et al. |
| 2009/0100217 A1 | 4/2009 | Battaglia et al. |
| 2009/0109619 A1 | 4/2009 | Wise et al. |
| 2009/0135558 A1 | 5/2009 | Hughes |
| 2009/0147462 A1 | 6/2009 | Zhu et al. |
| 2009/0154098 A1 | 6/2009 | Nguyen |
| 2009/0172279 A1 | 7/2009 | Yuan et al. |
| 2009/0185355 A1 | 7/2009 | Zhu et al. |
| 2009/0198927 A1 | 8/2009 | Bondurant et al. |
| 2009/0210636 A1 | 8/2009 | Karamcheti et al. |
| 2009/0257191 A1 * | 10/2009 | Ecker ................. H05K 7/20736 361/690 |
| 2009/0279243 A1 | 11/2009 | Amidi et al. |
| 2010/0002382 A1 | 1/2010 | Aybay et al. |
| 2010/0014248 A1 | 1/2010 | Boyden et al. |
| 2010/0142243 A1 | 6/2010 | Baxter |
| 2010/0323757 A1 | 12/2010 | Seflic et al. |
| 2010/0328886 A1 | 12/2010 | Nguyen |
| 2010/0332711 A1 | 12/2010 | Li et al. |
| 2011/0080701 A1 | 4/2011 | Bisson et al. |
| 2011/0153903 A1 | 6/2011 | Hinkle et al. |
| 2011/0222234 A1 | 9/2011 | Davis et al. |
| 2011/0261521 A1 | 10/2011 | Lo |
| 2011/0292588 A1 | 12/2011 | Seeley |
| 2012/0010754 A1 | 1/2012 | Matteson |
| 2012/0050986 A1 * | 3/2012 | Riebel .................... H05K 7/1488 361/679.48 |
| 2012/0120596 A1 | 5/2012 | Bechtolsheim |
| 2012/0233402 A1 | 9/2012 | Laaksonen et al. |
| 2012/0278534 A1 | 11/2012 | Sun et al. |
| 2012/0327597 A1 | 12/2012 | Liu et al. |
| 2013/0054862 A1 | 2/2013 | Tsai |
| 2013/0107424 A1 | 5/2013 | Thomas et al. |
| 2013/0107443 A1 | 5/2013 | Kim et al. |
| 2013/0148287 A1 | 6/2013 | Chang |
| 2013/0163175 A1 | 6/2013 | Kim et al. |
| 2013/0176676 A1 | 7/2013 | Keffeler et al. |
| 2013/0176677 A1 | 7/2013 | Rust et al. |

(56) References Cited

U.S. PATENT DOCUMENTS

| | | |
|---|---|---|
| 2013/0342989 A1 | 12/2013 | Singleton |
| 2014/0078660 A1 | 3/2014 | Dondzik et al. |
| 2014/0087787 A1 | 3/2014 | Rivera-Sanchez |

FOREIGN PATENT DOCUMENTS

| | | | |
|---|---|---|---|
| EP | 2275913 A1 | 1/2011 | |
| JP | 06-309860 A | 4/1994 | |
| WO | 03063560 A2 | 7/2003 | |
| WO | 2005029936 A1 | 3/2005 | |
| WO | 2007056669 A2 | 5/2007 | |
| WO | 2008103359 A1 | 8/2008 | |
| WO | 2009015285 A1 | 1/2009 | |
| WO | 2013029264 A1 | 3/2013 | |

OTHER PUBLICATIONS

Doug Hoy, "Delphi Connection Systems Adds to Growing Portfolio with Introduction of PCI Express(TM), DDR2-DIMM Series; Computing Products' Availability Announced During Appearance at IDF.," PR Newswire, http://www.thefreelibrary.com/Delphi+Connection+Systems...s+to+Growing+Portfolio+with+Intruction...-a0121678034, Sep. 7, 2004 (4 pages).

StarTech.com, "Removable 2.5" SATA HDD Enclosure/Backup System/Mobile Rack for 3.5/5.25" Bay", Product ID: SAT2510U3REM, http://www.startech.com/HDD/Mobile-Racks/Removable-Hard-Drive-Enclosure-Backup-System~SAT2510U3REM, date accessed Apr. 16, 2014 (3 pages).

PC Support Services Ltd., "The Saturn Mobile Rack", http://www.pcssl.co.nz/documents/prodinfo/addonics/Saturn%20and%20Cipher/MobileRack.htm, dated accessed Apr. 16, 2014 (5 pages).

ICY DOCK, "EZ-Fit MB990SP-B Tool-less Dual 2.5" SSD/HDD Mounting Kit / Bracket", http://www.icydock.com/goods.php?id=79, date accessed Apr. 16, 2014 (3 pages).

"Removable Memory Cartridge Houses 2.5-Inch SATA Drives", http://www.cotsjournalonline.com/articles/view/103844, date accessed Apr. 16, 2014 (1 page).

Tapeonline.com, "Imation RDX 500GB Removable Cartridge", http://www.tapeonline.com/products/imation-rdx-rdx-500gb-removable-cartridge, date accessed Apr. 16, 2014 (2 pages).

"Quantum RDX", Quantum Datasheet, http://www.quantum.com/products/removablediskdrives/rdx/index.aspx, date accessed Apr. 16, 2014 (2 pages).

Plastiras, Elias, "HP Z1 workstation (B4F79PA) review", PC World, http://www.pcworld.idg.com.au/review/hp/z1_workstation_b4f79pa_review/426935/, Jul. 6, 2012 (12 pages).

"CWC Debuts Low-Cost Rugged, Removable Solid State Memory Module Carrier", http://www.unmannedsystemstechnology.com/2013/12/cwc-debuts-low-cost-rugged-removable-solid-state-memory-module-carrier/, dated Dec. 19, 2013 (2 pages).

Curtiss-Wright, "Curtiss-Wright Acquired Parvus Corporation, Extends Curtiss-Wright's Capabilities in Rugged Small Form Factor Computing and Communications Subsystems", http://www.parvus.com/product/overview.aspx?prod=RuggedRemovableMassStorage, date accessed Apr. 15, 2014 (2 pages).

Curtiss-Wright, Press Release, "Curtiss-Wright Controls Introduces Rugged Cartridges for Standard High-Density SATA Solid State Drives", http://news.thomasnet.com/fullstory/Rugged-Cartridges-facilitate-removeable-SATA-SSD-deployment-20019299, dated Dec. 12, 2013 (7 pages).

Synchrotech, "PCMCIA ATA Flash PC Cards FMJ Industrial", http://www.synchrotech.com/products/ata-flash-pcmcia-memory-pc_cards_12-fmj-industrial.html, date accessed Apr. 15, 2014 (2 pages).

Molex, "CompactFlash™", http://www.molex.com/molex/products/family?channel=products&chanName=family&key=compactflash, date accessed Apr. 15, 2014 (5 pages).

* cited by examiner

ELECTROMAGNETIC INTERFERENCE CONTAINMENT SYSTEM

CROSS-REFERENCE TO RELATED APPLICATIONS

Pursuant to 35 U.S.C. § 119(e), this application claims benefit of U.S. Provisional Application No. 62/005,787 filed on May 30, 2014, entitled "STORAGE ASSEMBLY SYSTEM." The disclosure of the U.S. Provisional Application is incorporated herein by reference in its entirety.

BACKGROUND

Storage assembly systems may include a chassis to house various components of the system. In particular, a storage assembly system may include components such a flash modules and printed circuit boards. These components may experience electromagnetic interference (EMI) unless these components are properly shielded.

DETAILED DESCRIPTION

Figure 1A:
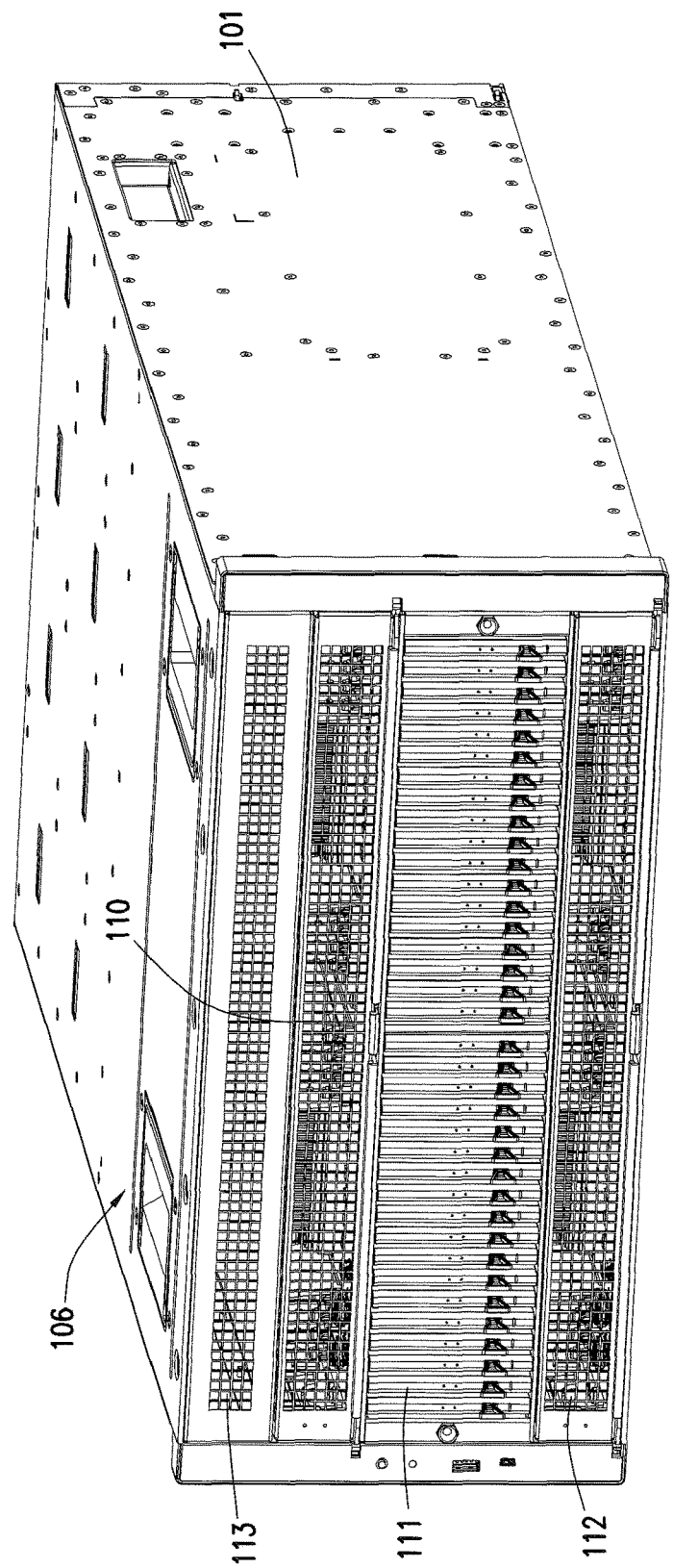
FIG. 1A shows a perspective view of a storage assembly in accordance with embodiments of the invention.

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In the following description of FIGS. 1-9, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment which may be implemented in addition to, in conjunction with, or in place of the embodiments described with regard to a corresponding like-named component in any other figure.

In one aspect, embodiments disclosed herein relate generally to a chassis of a storage assembly system. More specifically, one or more embodiments disclosed herein may be directed to one or more components of a chassis of a storage assembly system. For example, one or more embodiments disclosed herein relate to chassis having an EMI gasket that is configured to contact a cover of a flash module when the flash module is mounted on the chassis. Further, one or more embodiments disclosed herein relate to a flash module having a cover, in which the cover provides EMI shielding for the flash module. EMI may be considered a disturbance that may affect an electrical circuit due to induction or radiation from an external electromagnetic source. Such a disturbance may limit or negatively affect the performance of the circuit and may potentially lead to the loss of data.

Although one or more of these embodiments may be preferred, the embodiments disclosed should not be interpreted, or otherwise used, as limiting the scope of the disclosure, including the claims. In addition, those skilled in the art will appreciate that the following description has broad application, and the discussion of any embodiment is meant only to be exemplary of that embodiment, and not intended to suggest that the scope of the disclosure, including the claims, is limited to that embodiment.

Certain terms are used throughout the following description and claims to refer to particular features or components. As those skilled in the art will appreciate, different persons may refer to the same feature or component by different names. This document does not intend to distinguish between components or features that differ in name but not function. The figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first component is coupled to a second component, that connection may be through a direct connection, or through an indirect connection via other components, devices, and connections.

Figure 1B:
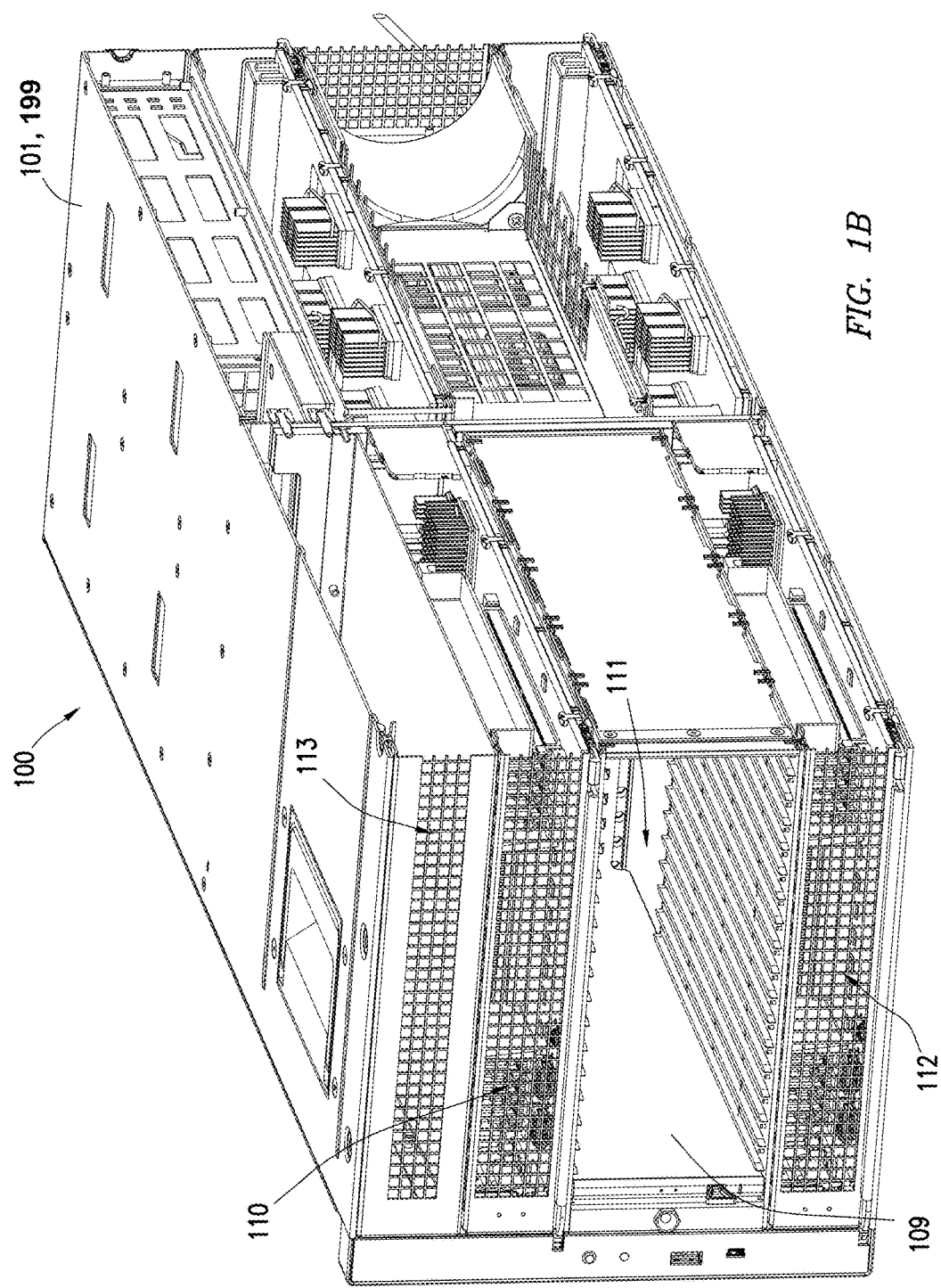
FIG. 1B shows a perspective view of a storage assembly in accordance with embodiments of the invention.

One or more aspects of the present disclosure are directed to a storage assembly system. Referring to FIGS. 1A and 1B, multiple perspective views of a storage assembly system 106 in accordance with embodiments disclosed herein are shown.

In one or more embodiments, the storage assembly system (106) may include a chassis (101), in which one or more components may be disposed and secured within. For example, as shown in FIG. 1B, one or more flash modules (109) are disposed within a front portion of the chassis (101). In one or more embodiments, the one or more flash modules (109) may be engaged within the chassis (101) of the storage assembly system (106).

Further, as shown, one or more openings may be formed through the chassis (101) of the storage assembly system (106), where the one or more openings may permit airflow through the chassis (101) of the storage assembly system (106). In one or more embodiments, the aforementioned openings formed through the chassis (101) may include an upper airflow chamber (110), a central airflow chamber (111), and a lower airflow chamber (112). In one or more embodiments, structural arrangement of one or more internal components may allow airflow to be controllably directed from each of the upper airflow chamber (110) and the lower airflow chamber (112) into the central airflow chamber (111). In one embodiment of the invention, the chassis (101) further includes a vent (113) that may allow airflow through the chassis (101).

In one or more embodiments, the one or more flash modules (109) may be spaced apart when engaged within the chassis (101) of the storage assembly system (106) to allow airflow between one or more flash modules (109) into an interior of the chassis (101).

As shown in FIG. 1B, the storage assembly (100) includes the chassis (101) and the upper airflow chamber (110), the central airflow chamber (111), and the lower airflow chamber (112). A fan module (not shown) may be used to pull air through each of the upper airflow chamber (110), the central airflow chamber (111), and the lower airflow chamber (112.

Figure 2:
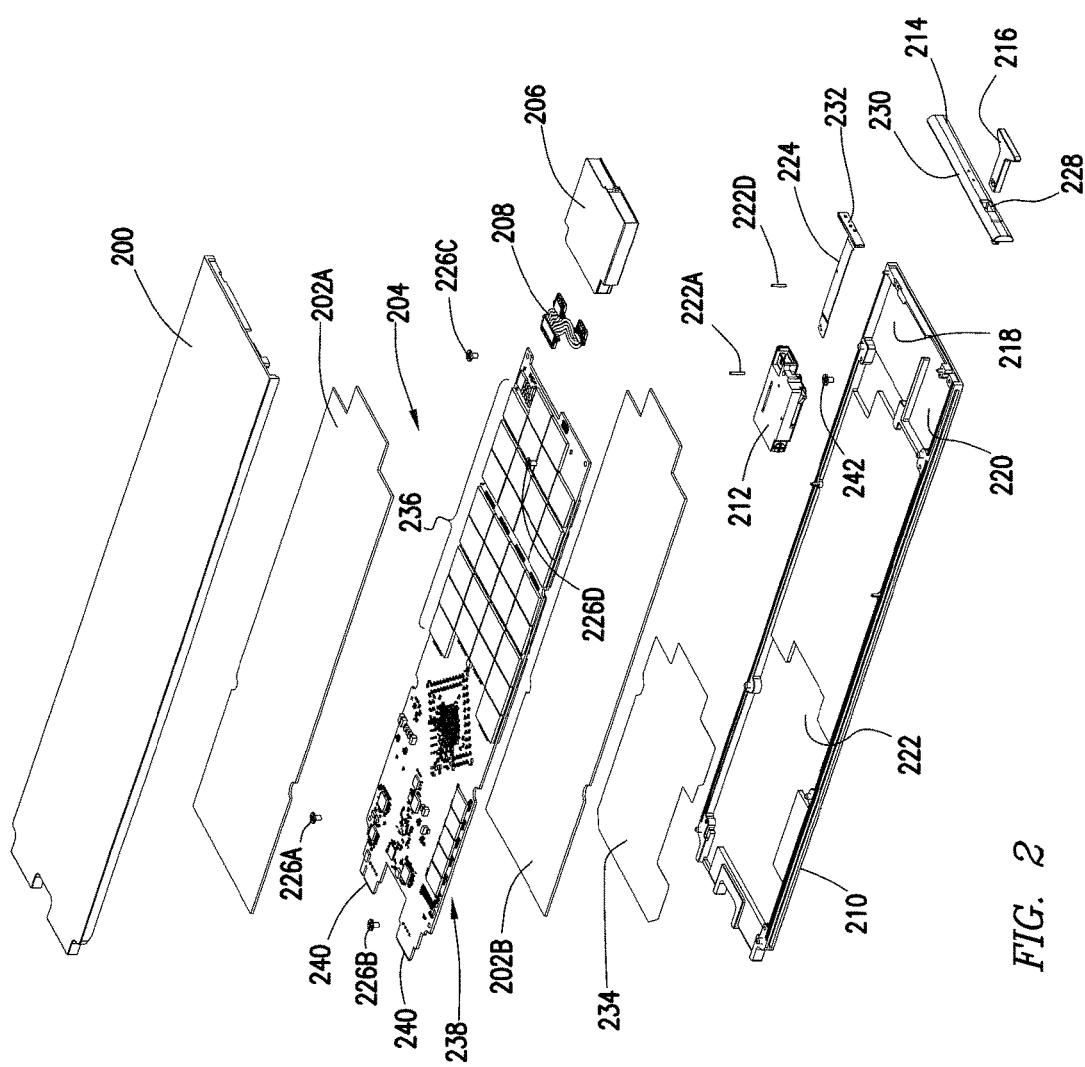
FIG. 2 shows an exploded view of a flash module in accordance with embodiments of the invention.

FIG. 2 shows an exploded view of a flash module in accordance with one or more embodiments of the invention. The flash module includes a top cover (200) and a bottom cover (210). The top cover (200) is in direct contact with a thermal interface material (TIM) (202A). In one embodiment of the invention, the TIM is a malleable material such as a silicon-based putty or gel. Other TIMs may be used without departing from the invention. The TIM (202A) is also in direct contact with all (or substantially all or a significant portion of) the components on the top surface of the printed circuit board (PCB) (204). For example, the TIM (202A) is in direct contact with the solid state storage (236) and the memory (238). The TIM (202A), in one or more embodiments of the invention, is positioned within the flash module as to limit the air gaps between the components on the top surface of the PCB and the TIM (202A). Further, in one or more embodiments, the TIM material (e.g., TIM (202A) and/or TIM (202B)) may fill a gap or space between PCB components and a cover (e.g., the top cover (200) and/or the bottom cover (210)) of the flash module.

In one embodiment of the invention, solid state storage may include, but is not limited to, NAND Flash memory, NOR Flash memory, Magnetic RAM Memory (MRAM), Spin Torque Magnetic RAM Memory (ST-MRAM), Phase Change Memory (PCM), memristive memory, or any other memory defined as a non-volatile Storage Class Memory (SCM). Those skilled in the art will appreciate that embodiments of the invention are not limited to storage class memory.

In one embodiment of the invention, the memory (238) corresponds to any volatile memory including, but not limited to, Dynamic Random-Access Memory (DRAM), Synchronous DRAM, SDR SDRAM, and DDR SDRAM.

In one embodiment of the invention, the TIM (202A) does not extend over the super capacitor assembly (206), the cable assembly (208) that connects the PCB (204) to the super capacitor assembly (206), or the latch assembly (212).

In one embodiment of the invention, the super capacitor assembly (206) includes a super capacitor enclosed in an insulator, e.g., a plastic insulator. The insulator surrounding the super capacitor is in direct contact with the top cover (200) and the bottom cover (210). The flash module includes a controller (or series of controllers) (e.g., a hot-swap controller) that is configured to monitor voltage drops across the flash module. This functionality allows the flash module to detect when it is disconnected from a midplane of the chassis of a storage assembly. When the flash module is disconnected from the midplane, the components on the flash module (including components on the PCB) continue to receive power for a period of time in order to ensure that all data that is currently stored in the memory (or all data in memory that needs to be persistently stored) (238) is stored in solid state storage on the flash module. This functionality may ensure that no data is lost when the flash module is disconnected from power (e.g., disconnected from the midplane). The super capacitor is sized to ensure that there is sufficient power to enable the aforementioned functionality. The super capacitor may be included within a cavity (218) within the bottom cover (210).

In one embodiment of the invention, solid state storage is mounted on both the top surface of the PCB (see e.g., solid state storage (204)) and the bottom surface of the PCB. In one embodiment of the invention, the total storage capacity of the solid state storage in a given flash module is between 2 TB-16 TB.

In one embodiment of the invention, the memory (see e.g., memory (238)) is mounted on both the top surface of the PCB and the bottom surface of the PCB. In one embodiment of the invention, the total storage capacity of the memory in a given flash module is between 2-4GB. The invention is not limited to the aforementioned memory size range. In one embodiment of the invention, the ratio of the storage capacity of the memory to the storage capacity of the solid state storage is 1:1000. The invention is not limited to the aforementioned ratio.

In one embodiment of the invention, the top and bottom covers of the flash module are made of Aluminum. However, those skilled in the art will appreciate that they may be made of any other material that functions to (i) dissipate heat and/or (ii) shield the internal components in the flash module from electromagnetic interference (EMI). In one embodiment of the invention, the top and bottom covers of the flash module act as heat sinks. The top and bottom covers may be made of other materials such as composites, alloys, or any other material that has high thermal conductivity. The selection of a specific material for the top and bottom cover of the flash module may vary based on the amount of heat the needs to be removed from the flash module. Further, while the flash module is described using a single material for the top and bottom covers, the top and bottom covers of the flash module may be made of different materials. Further, the materials used for a given cover may also be non-uniform such that one portion of a cover may be made of a first material and a second portion of the cover may be made of a second material.

In one embodiment of the invention, the PCB is attached to the bottom cover (210) via screws (e.g., 226A, 226B, 226C, and 226D).

In one embodiment of the invention, a heat spreader (234) is located between the bottom cover (210) and the TIM (202B). The heat spreader (234) may be made of any material that provides efficient heat dissipation in order to prevent any hotspots on the bottom cover as a result of the heat generated by the storage controller that is mounted on the bottom surface of the PCB. The heat spreader (234) may be made of, for example, carbon fiber. The heat spreader may use other materials without departing from the invention. The heat spreader (234) may be located in a cavity (222) within the bottom cover (210). The TIM (202B) is in direct contact with the heat spreader (222). The TIM (202B) may not be in contact with the latch assembly (212) or the super capacitor (206).

In one embodiment of the invention, the storage controller includes functionality to service read requests to read data from the solid state storage and/or to service write requests to write data to the solid state storage. The storage controller includes a single or multi-channel architecture to access the memory (238). Further, the storage controller may implement and/or support single data rate (SDR), double data rate (DDR), and/or Quad data rate (QDR) transfers.

The TIM (202B) may be in direct contact with all (or substantially all or a significant portion of) the components on the bottom surface of the printed circuit board (PCB) (204). For example, the TIM (202B) may be in direct contact with the solid state storage and the memory. The TIM (202B), in one or more embodiments of the invention, is positioned within the flash module as to limit the air gaps between the components on the bottom surface of the PCB and the cover (210).

The flash module may include a bezel (230) that connects to the top and bottom covers (200, 210) of the flash module. The bezel (230) may include a hole (228) through which a handle (216) may be inserted, where the handle (216) is part of the latch assembly (212). The bezel may also have a flat surface (214) that includes one or more indicator lights. The bezel may have a different geometry as compared to what is shown in FIG. 2 without departing from the invention. The bezel (230) may be positioned within the flash module using, e.g., a pin (222A), and may further be secured to the flash module using a screw (242).

The top and bottom covers of the flash module may be connected together by press fitting. Said another way, the top and bottom covers are pressed together to create the flash module. In such cases, there are no external fasteners are used to connect the top and bottom covers of the flash modules to each other. The lack of external fasteners may enable the flash module to be tamper resistant. In other embodiments of the invention, the top and bottom covers may be connected together using external fasteners including, but not limited to, screws, pins, epoxy (or other adhesive chemical compounds).

In one embodiment of the invention, the flash module is hot-swappable. This functionality is implemented by a hot-swap controller that is attached to either the top or bottom of the PCB. The hot-swap controller may be an implemented, using a general purpose processor, an application-specific integrated circuit (ASIC), a Field Programmable Gate Array (FPGA), or any other integrated circuit. In one embodiment of the invention, when the flash module is disconnected from the midplane, the hot-swap controller electrically isolates the flash module from the midplane and other components connected thereto. This enables all power that is discharged from the super capacitor to be used only to power the flash module and not to power other components external to the flash module.

The flash module may include an indictor (232) that includes one or more light emitting diodes (LEDs) (or other light sources). The LEDs may include provide a visual indication of the status and/or whether the flash module is powered on. The LEDs may provide other status information without departing from the invention. The indicator (232) may receive power and signal information via a flex circuit (224).

Though not shown in FIG. 2, the indicator (232) may also include a mechanical switch that interfaces with the latch assembly (212). When the handle (216) is pulled outward in order to remove the flash module from the chassis, the mechanical switch will be displaced (or otherwise moved) resulting in a signal being sent to the storage controller. The storage controller, upon receipt of the signal, triggers the transfer of all or a portion of the data currently stored in the memory (e.g., 238) to the solid state storage (236). The aforementioned mechanism may allow the storage controller additional time to transfer data from the memory to the solid state storage prior to the flash module being disconnected from the midplane. Once the flash module is disconnected from the midplane, components the flash module may continue to receive power from the super capacitor (described above) (206). In one embodiment of the invention, the mechanical switch may be implemented in embodiments in which the super capacitor is not able to discharge sufficient power, i.e., the super capacitor is not able to power the flash module for a period of time that is sufficient to ensure that all data (or all data that needs to be persistently stored) that is currently stored in the memory (238) is stored in solid state storage on the flash module.

In one embodiment of the invention, the flash module has the following dimensions: 80 mm×8.5 mm×304 mm (H×W×D). The flash module is not limited to the aforementioned dimensions. The depth of the flash module may correspond to the distance between the front portion of the chassis and the midplane. The flash module width may be designed such that 36 flash modules can be concurrently inserted within a chassis. The height of the flash module may be 2 U (or substantially 2 U).

The flash module also includes two 4× Peripheral Component Interconnect Express (PCIe) connectors (240). The two 4× PCIe connectors enable the flash module to connect to the midplane. Once a flash module is connected to the midplane the flash module may communicate via the midplane with one or more other components that are also connected to the midplane.

In other embodiments of the invention the flash module may implement connectors that conform with one or more of the following protocols: Peripheral Component Interconnect (PCI), PCI-eXtended (PCI-X), Non-Volatile Memory Express (NVMe), Non-Volatile Memory Express (NVMe) over a PCI-Express fabric, Non-Volatile Memory Express (NVMe) over an Ethernet fabric, and Non-Volatile Memory Express (NVMe) over an Infiniband fabric. Those skilled in the art will appreciate that the invention is not limited to the aforementioned protocols.

While the above description indicates that screws are used to affix the PCB to the bottom cover of the flash module, other connecting means may be used in place of screws. The other connecting means may include pins, epoxy, springs, or other physical components or adhesive chemical compounds that may be used to affix the PCB to the bottom cover within the flash module.

Though not described above, those skilled in the art will appreciate that the PCB may include other components mounted thereon.

Figure 3:
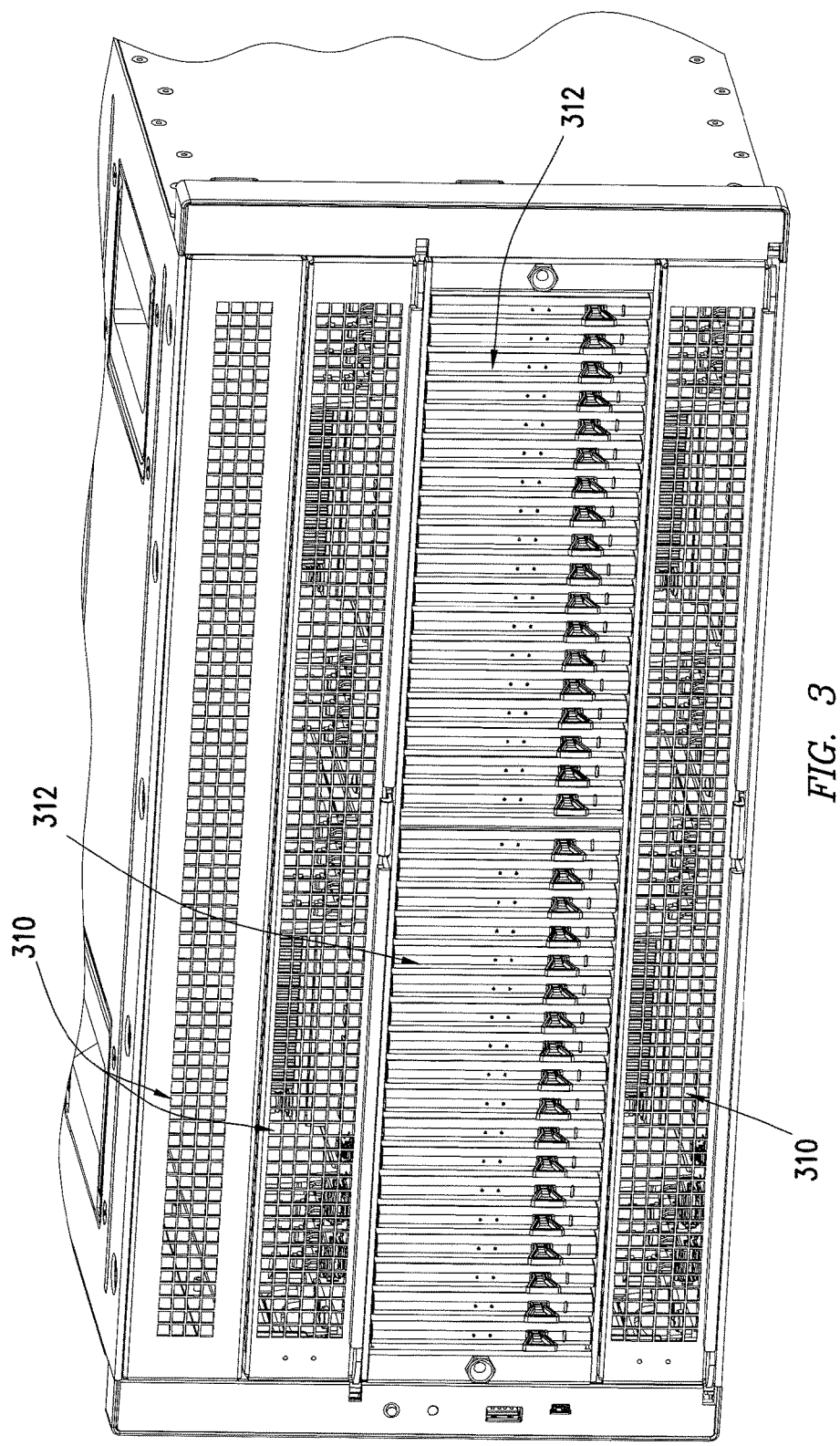
FIG. 3 shows a front view of the storage assembly system in accordance with one or more embodiments of the invention.

FIG. 3 shows a front view of the storage assembly system in accordance with one or more embodiments of the invention. The storage assembly system (also referred to as a chassis) includes front face electromagnetic interface (EMI) containment in sections denoted (310). The front face EMI containment may be implemented using metal screens, metal meshes, etc, which may enable air to flow there through. The chassis implements rear face EMI containment in section (312), i.e., the section in which the flash modules are inserted. The absence of the front face EMI containment in section (312) permits air to flow across the top and bottom covers of the flash modules. Further, while there is no chassis level EMI containment across the front of section (312), each of the individual flash modules includes its own individual EMI containment (namely the top cover, bottom cover, and bezel).

Figure 4:
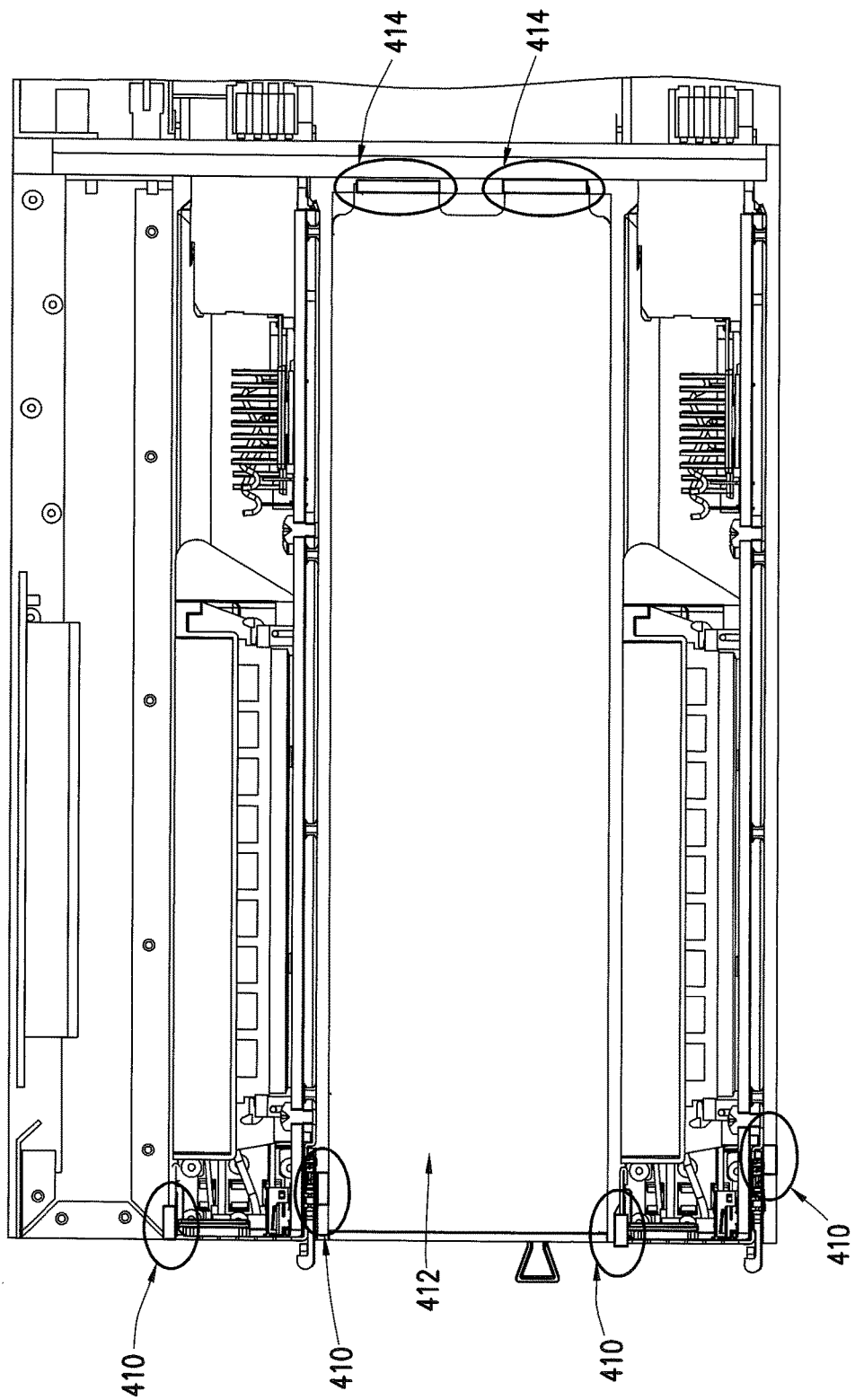
FIGS. 4-5 show side views of the storage assembly system in accordance with one or more embodiments of the invention.
Figure 5:
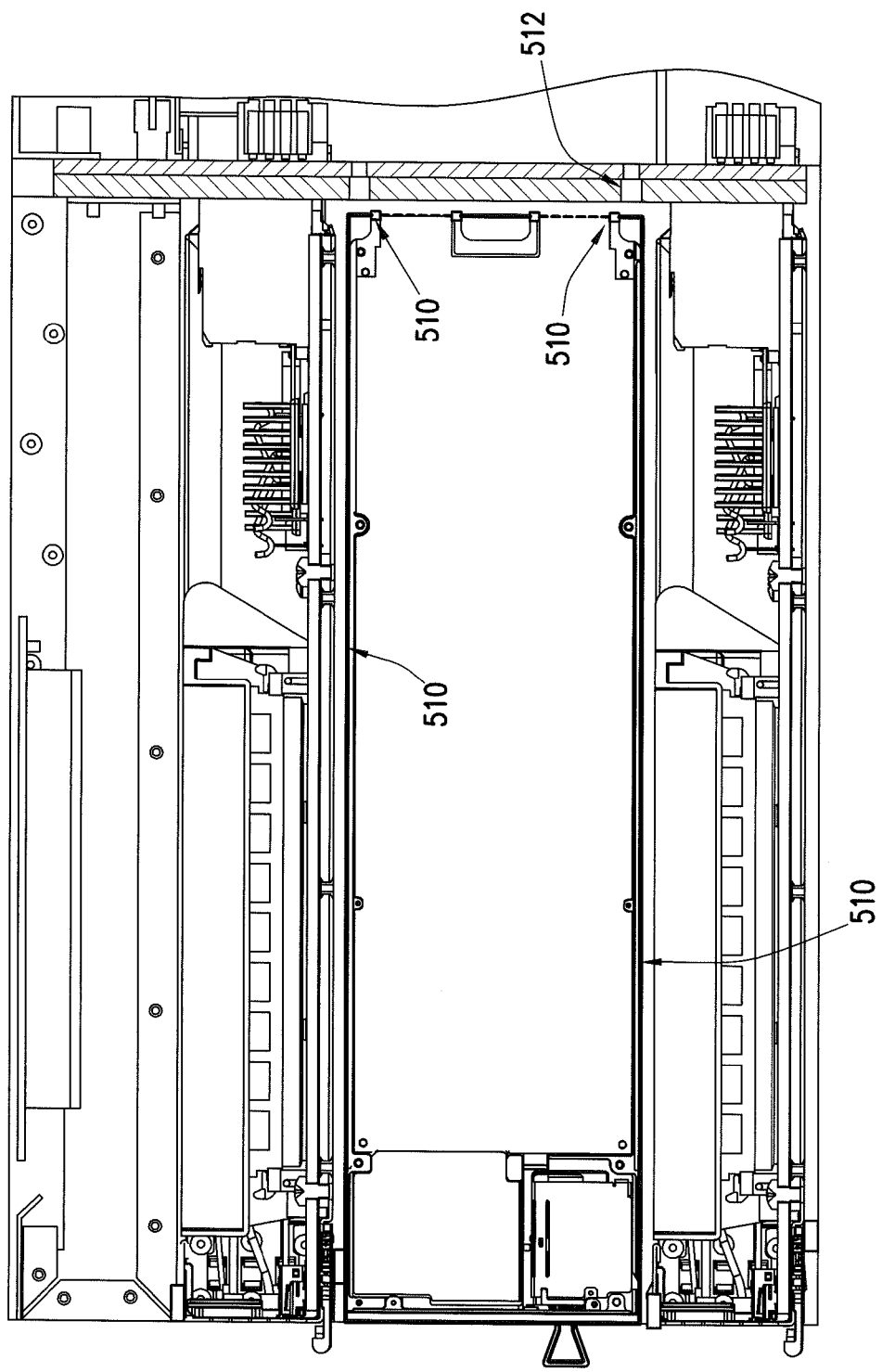

FIGS. 4-5 show side views of the storage assembly system in accordance with one or more embodiments of the invention. Referring to FIG. 4, EMI containment for sections 310 in FIG. 3 may include EMI gaskets (410) located at or near the perimeter of the chassis. As previously discussed, the flash module cover (412) provides essentially complete EMI containment for the flash module expect for a small region at the rear portion of the flash module where the PCIe connectors extend past the end of the top and bottom cover of the flash module (see e.g., FIG. 2, PCIe connector (240)). EMI containment on the each of the flash modules may be achieved using an EMI gasket (414). The EMI gasket may be any suitable material including foams, gels, or any other material and/or compound that is suitable to serve as a gasket for EMI containment. Referring to FIG. 5, when the flash module is plugged-in (or otherwise connected) to the midplane, the ends of the flash module covers from the which the PCIe connectors extend are in contact with the EMI gasket (e.g., the EMI gasket (414) shown in FIG. 4) thereby extending the EMI containment (e.g., in the form of a Faraday Cage) to the midplane, thus establishing a complete enclosure which includes electrically conductive solid materials and/or meshes. The components inside the faraday cage, such as the flash module components shown in FIG. 2 and including the PCIe connectors, are thus protected from external electrical fields.

A metal stiffener (512) is located between the flash modules and the midplane. The metal stiffener (512) shields the rest of the chassis from the module bay (i.e., the portion of the chassis in which the flash modules are inserted). The metal stiffener (512) may include ventilation holes that enable thermal cooling of the flash modules. The absence of EMI gaskets within the front face of the chassis in section 312 (in FIG. 3) may enable improved airflow through the module bay.

Figure 6:
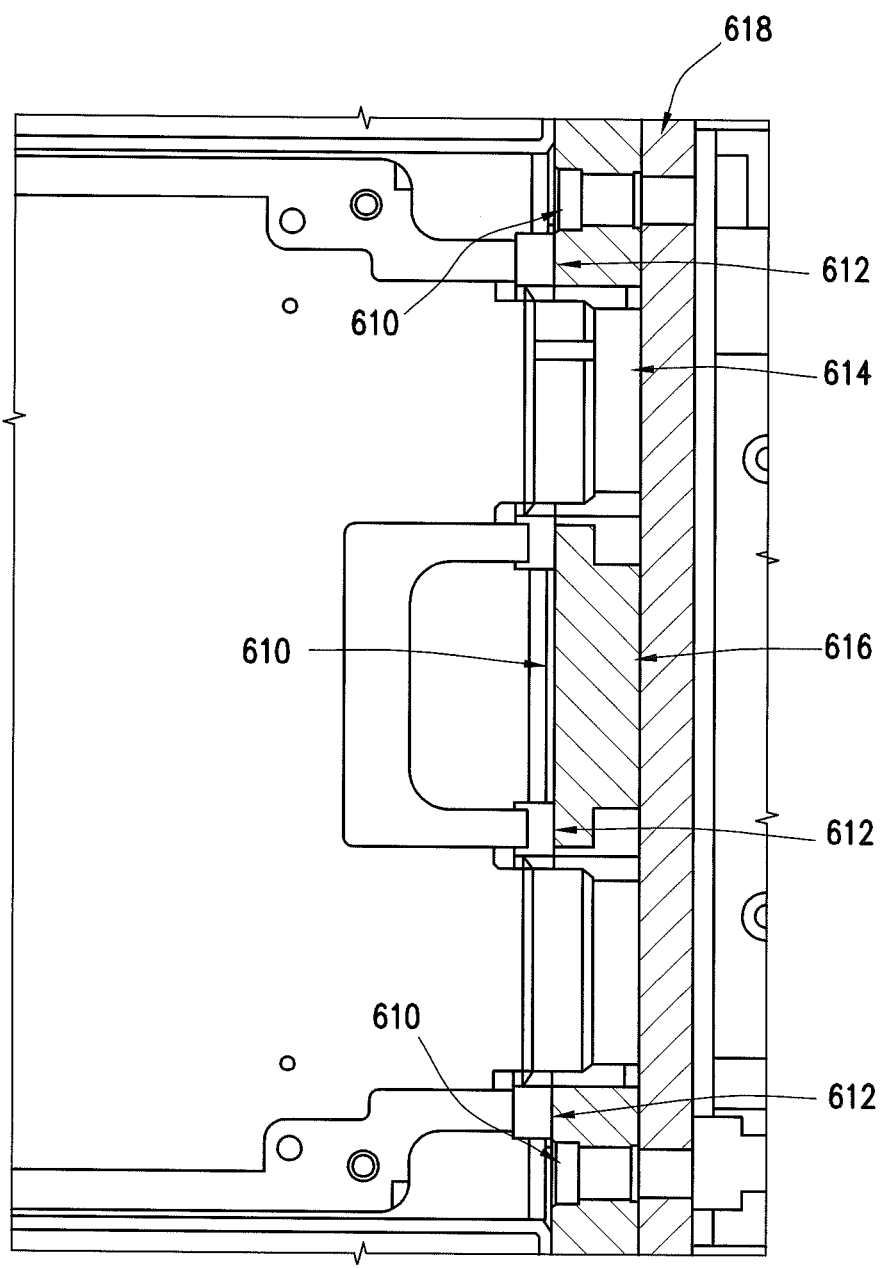
FIG. 6 shows a detailed section view of the storage assembly system in accordance with one or more embodiments of the invention.

FIG. 6 shows a detailed section view of the storage assembly system in accordance with one or more embodiments of the invention. When inserted into the midplane (618), the PCIe connectors are shrouded by the flash module covers and the metal stiffener (616) thereby providing EMI containment for the flash module and also for the module bay (discussed above). The EMI gaskets (612) are interposed between the flash module and the metal stiffener in order to close any gaps between the flash module and the metal stiffener. The metal stiffener (616) may be Aluminum (or any other material that may be used to EMI containment) The metal stiffener (616) may also include one or more holes (610) to permit airflow from the module bay to the rear portion of the chassis.

Figure 7:
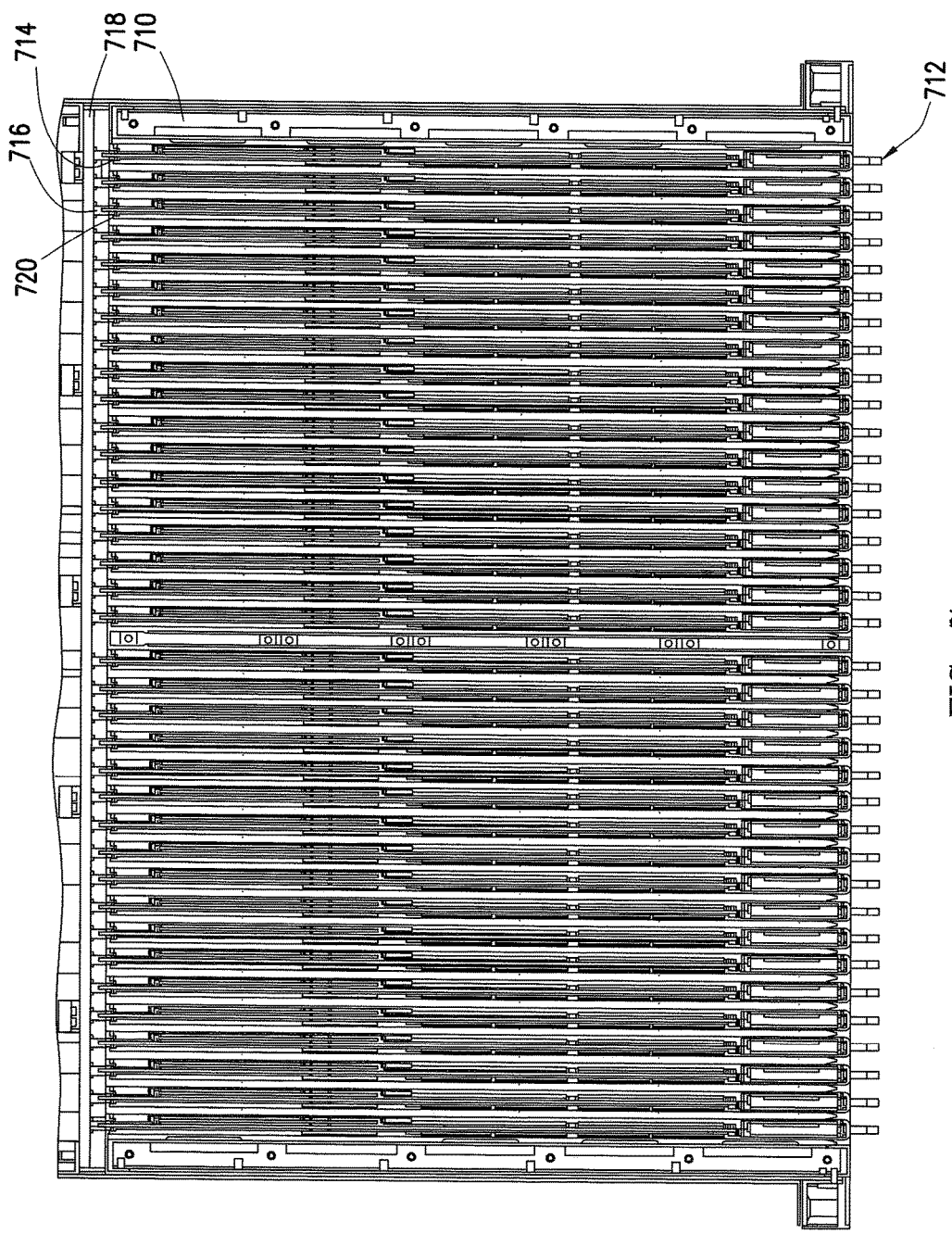
FIG. 7 shows a top view of the storage assembly system in accordance with one or more embodiments of the invention.

FIG. 7 shows a top view of the storage assembly system in accordance with one or more embodiments of the invention. FIG. 7 shows the placement of 36 flash modules (712) within the chassis (710). Further, the PCIe connectors of each of the flash modules are connected, via the holes (716) within the metal stiffener and EMI gasket, to the midplane (718). An EMI gasket (720) and metal stiffener (714) are interposed between the midplane and the flash modules.

Figure 8:
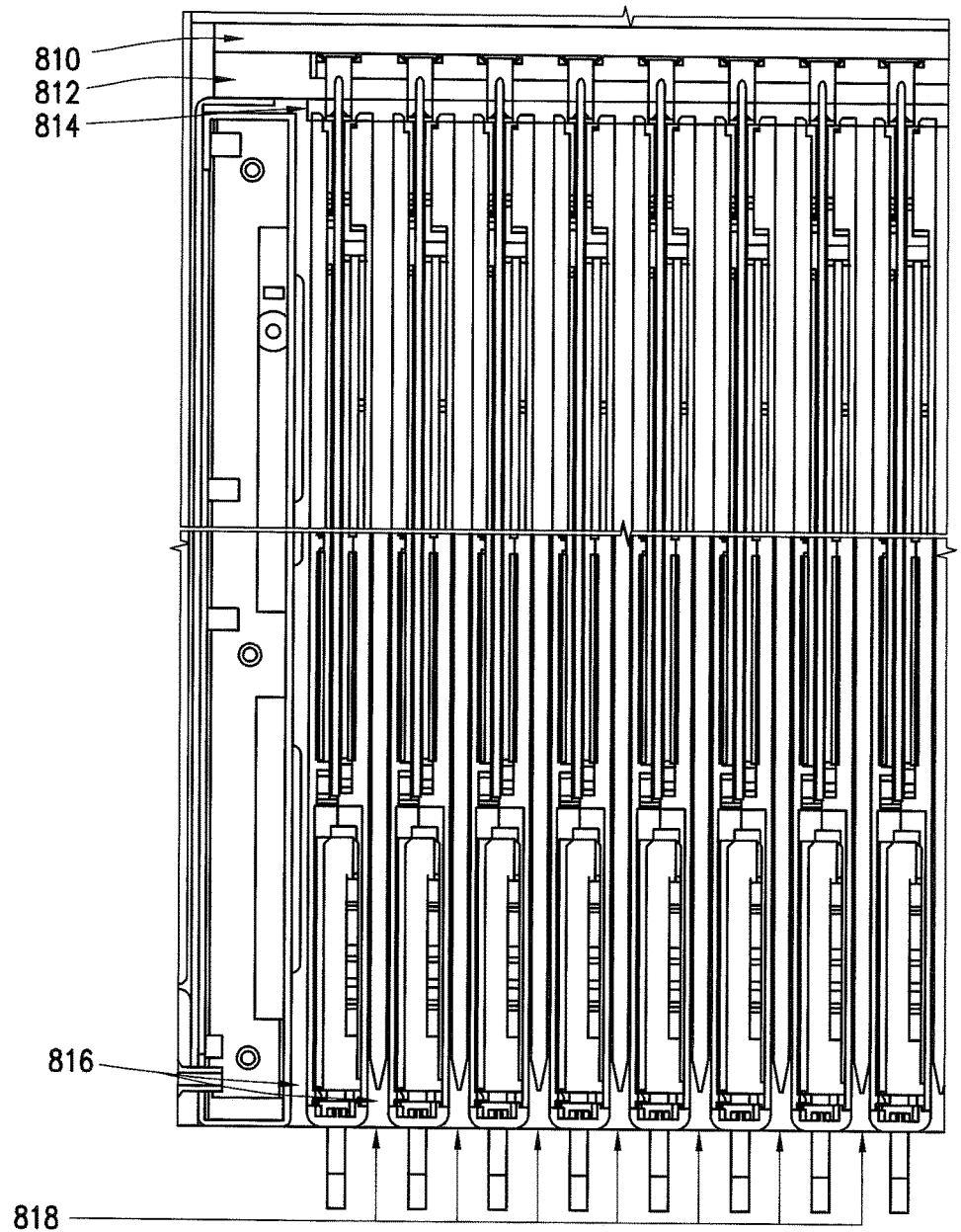
FIG. 8 shows a detailed top view of the storage assembly system in accordance with one or more embodiments of the invention.

FIG. 8 shows a detailed top view of the storage assembly system in accordance with one or more embodiments of the invention. Referring to FIG. 8, air (818) may pass through the spaces between the flash modules (816). The absence of EMI gaskets between the flash modules enables air to flow across the surface of the flash modules, thereby enable cooling of the flash modules. As shown in FIG. 8, the flash modules are connected to the midplane (810). The miplane (or portions thereof) are covered with a metal stiffener (812). Finally, an EMI gasket (814) covers at least a portion of the metal stiffener.

Figure 9:
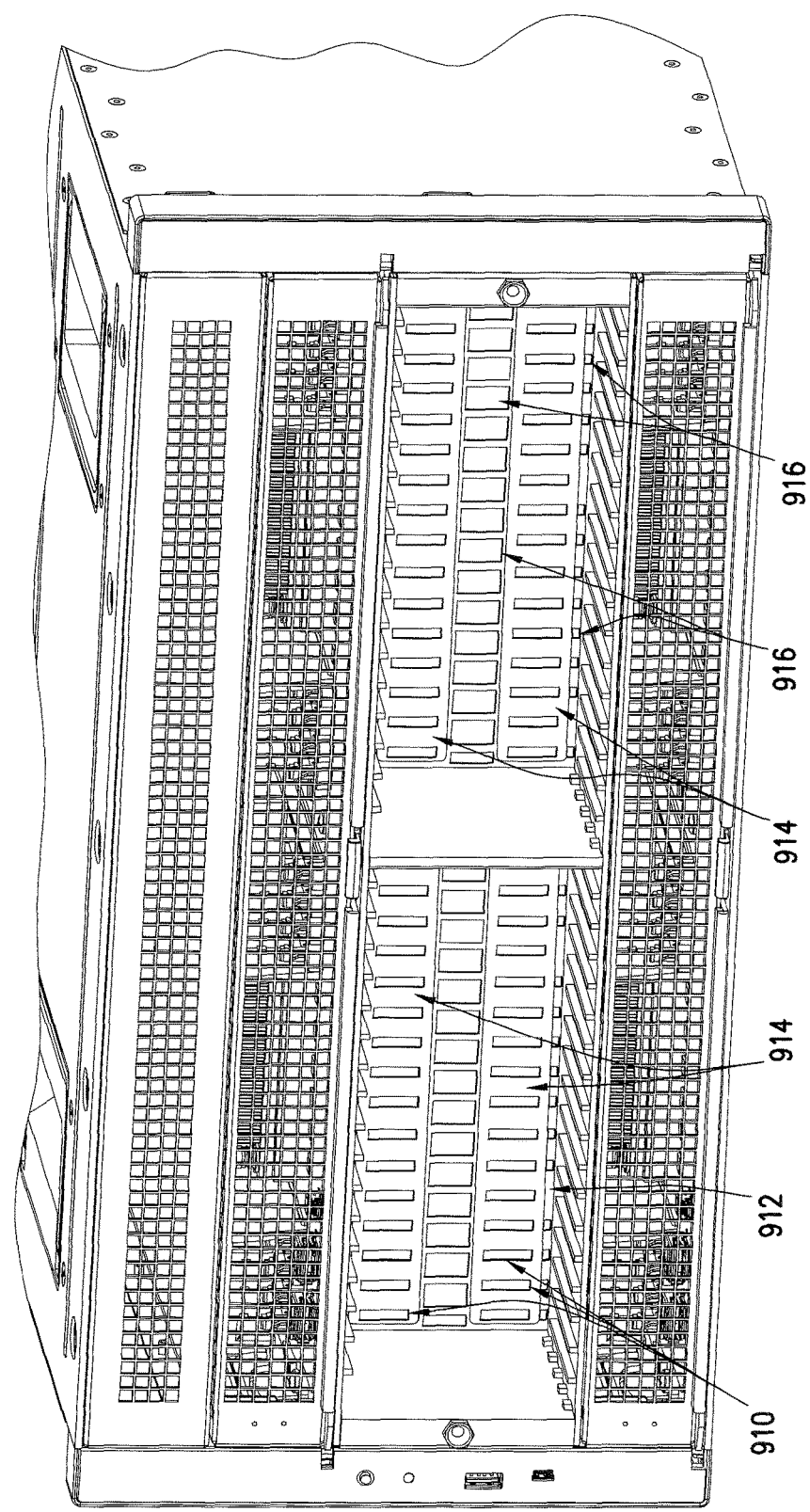
FIG. 9 shows a front view of the storage assembly system in accordance with one or more embodiments of the invention.

FIG. 9 shows a front view of the storage assembly system in accordance with one or more embodiments of the invention. Referring in FIG. 9, the midplane includes module connectors (910) at which the PCIe connectors are configured to interface. A metal stiffener (912) is included in front of the midplane and includes numerous holes (916) to permit air flow there through and holes to permit the PCIe connector to pass through. Finally, an EMI gasket(s) (914) is placed on the metal stiffener around the holes in the metal stiffener through which the PCIe connector passes through. In one or more embodiments, the EMI containment solutions discussed herein with regard to the chassis (e.g., the chassis 101) and one or more flash modules (e.g., the flash module shown in FIG. 2), may provide EMI containment while also allowing air flow through the front portion of the chassis and out the rear portion of the chassis. Further, in one or more embodiments, each of the flash modules discussed herein may be a Faraday Cage. Further, in one or more embodiments, the chassis itself according to embodiments disclosed herein may be a Faraday Cage (199).

While the disclosure includes a limited number of embodiments, those skilled in the art, having benefit of this disclosure, will appreciate that other embodiments may be devised which do not depart from the scope of the disclosure. Although only a few example embodiments have been described in detail above, those skilled in the art will readily appreciate that many modifications are possible in the example embodiments without materially departing from this invention. Accordingly, all such modifications are intended to be included within the scope of this disclosure.

What is claimed is:
1. An electromagnetic interference (EMI) containment system, comprising:
 a chassis, comprising:
  a front section, comprising:
   a module bay configured to accommodate a plurality of removably insertable flash modules;
  a rear section that is EMI contained; and
  a separation section that separates the front section from the rear section, the separation section comprising:
   a metal stiffener, comprising:
    a first plurality of openings, configured to enable airflow between the module bay and the rear section; and
    a second plurality of openings; and
   a midplane printed circuit board (PCB), disposed between the metal stiffener and the rear section, the midplane PCB having a plurality of holes, each of the holes corresponding to a respective opening of the first plurality of openings to enable the airflow between the module bay and the rear section;
 at least one flash module of the plurality of removably insertable flash modules, disposed within the module bay, the at least one flash module comprising:
  a cover providing EMI containment to flash module circuits; and a connector that extends beyond the cover,
wherein upon insertion of the at least one flash module into the module bay:
the connector interfaces with the midplane PCB, through at least one of the second plurality of openings, and
the connector is EMI contained.

2. The chassis of claim 1, wherein the cover of the flash module provides heat dissipation to the flash module circuits.

3. The chassis of claim 2, wherein the airflow removes heat from the cover while traversing through the module bay.

4. The chassis of claim 2, wherein the airflow removes heat from the midplane PCB.

5. A chassis that does not provide chassis level electromagnetic interference (EMI) containment, the chassis comprising:
a module bay that does not provide EMI containment for flash modules disposed in the module bay;
a rear section that does provide EMI containment for elements disposed in the rear section;
a metal stiffener disposed between the module bay and the rear section, the metal stiffener comprising:
a first plurality of holes that enables an airflow between the module bay and the rear section; and
a second plurality of holes, wherein each hole of the second plurality of holes is configured to:
receive a flash module of the flash modules, and
form an electromagnetic seal between the metal stiffener and the flash module; and
a midplane printed circuit board (PCB), disposed between the metal stiffener and the rear section, the midplane PCB having a plurality of holes, each of the holes corresponding to a respective hole of the first plurality of holes, enabling the airflow between the module bay and the rear section,
wherein forming the electromagnetic seal provides the EMI containment for the flash module within the module bay.

6. The chassis of claim 5, wherein the rear section provides front EMI containment on a side of the rear section proximate to the metal stiffener, and wherein the airflow passes through the metal stiffener.

7. The chassis of claim 5, wherein the metal stiffener and a cover of the flash module provide the EMI containment of the flash module, and the module bay allows airflow to pass therethrough.

8. The chassis of claim 7, wherein the module bay does not provide front EMI containment, wherein the airflow passes through a front opening of the module bay.

9. The chassis of claim 5, wherein the module bay comprises a front opening that does not provide EMI containment, the front opening opposite to the metal stiffener.

* * * * *